United States Patent
Grimes et al.

(10) Patent No.: US 7,643,958 B2
(45) Date of Patent: *Jan. 5, 2010

(54) METHOD AND SYSTEM FOR VALIDATING PCI/PCI-X ADAPTERS

(75) Inventors: Keith Grimes, Colorado Springs, CO (US); Todd Jeffrey Egbert, Colorado Springs, CO (US); Edmund Paul Fehrman, Monument, CO (US)

(73) Assignee: LSI Corporation, Milpitas, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 11/999,300

(22) Filed: Dec. 4, 2007

(65) Prior Publication Data

US 2008/0091980 A1 Apr. 17, 2008

Related U.S. Application Data

(63) Continuation of application No. 11/262,864, filed on Oct. 31, 2005, now Pat. No. 7,389,196.

(51) Int. Cl.
*G01M 19/00* (2006.01)
*G06F 13/20* (2006.01)
(52) U.S. Cl. .................. 702/122; 710/313
(58) Field of Classification Search ............ 702/122, 702/117–118, 186, 107–108, 120, 182, 183; 710/5, 300, 305, 313, 2–3, 8–9, 15, 18–19, 710/29, 52, 55, 62; 714/43, 44, 46
See application file for complete search history.

(56) References Cited

U.S. PATENT DOCUMENTS

| | | | |
|---|---|---|---|
| 6,633,832 B1 * | 10/2003 | Browen | 702/186 |
| 7,111,102 B2 * | 9/2006 | Doak et al. | 710/305 |
| 7,389,196 B2 * | 6/2008 | Grimes et al. | 702/122 |

* cited by examiner

*Primary Examiner*—Michael P. Nghiem
*Assistant Examiner*—Toan M Le
(74) *Attorney, Agent, or Firm*—Matthew F. Lambrinos; Kermit D. Lopez; Luis M. Ortiz

(57) ABSTRACT

An automated system for validating Peripheral Component Interconnect (PCI) bus adapters or PCI-X bus adapters has a computer, motherboard, a PCI-X bus and isolated test slot for operatively coupling a PCI/PCI adapter under test through the PCI-X bus to the motherboard. The isolated test slot is adapted and arranged to minimize degradation of data flow on the PCI-X bus such that a PCI-X adapter, mounted in the isolated test slot, can negotiate a required operating rate greater than PCI operating rates. It can be configured as a low profile slot in a low profile computer system, such as a 2U low profile system. A method for validating the PCI/PCI-X bus adapters includes operatively coupling the bus adapter under test to the motherboard, negotiating to the required operating rate and testing the functionality of the adapter. The operating rate of the bus adapter can be verified to ensure the PCI/PCI-X bus adapters are tested at required PCI/PC-X rates.

9 Claims, 5 Drawing Sheets

METHOD AND SYSTEM FOR VALIDATING PCI/PCI-X ADAPTERS

CROSS-REFERENCES

This present application is a continuation of U.S. patent application Ser. No. 11/262,864, filed Oct. 31, 2005, now U.S. Pat. No. 7,389,196. The entire disclosure of said U.S. patent application Ser. No. 11/262,864 is herein incorporated by reference.

TECHNICAL FIELD

Embodiments relate to testing and diagnostics of computer peripheral components and, more particularly, to systems and methods for validating bus adapters. Additionally, embodiments relate to systems and methods for validating Peripheral Component Interconnect (PCI) and PCI-X adapter boards at PCI and PCI-X rates, respectively.

BACKGROUND

Peripheral Component Interconnect (PCI) local bus is a common input/output (I/O) bus standard developed for higher end computer systems. PCI bus adapters are circuit boards and/or integrated circuit adapters that provide input/output I/O processing on the PCI bus and physical connectivity between servers and storage devices transferring 32 or 64 bit data at a clock speeds of 33 MHz or 66 MHz.

PCI-X bus, an enhancement to conventional PCI bus specification, increases bus capacity enabling systems and devices to operate at bus frequencies above 66 MHz and up to 133 MHz using 32 or 64 bit bus width. Many of the differences of the PCI-X bus from the PCI bus relate to bus operation, wait states and protocol enhancements. Card form factor, pin-outs, connector, bus widths and general protocols are the same. PCI-X components, such as bus interfaces, PC bridges and extenders, are backward compatible allowing such components to be operable in conjunction with conventional PCI components. However, in such cases the PCI-X bus is designed to revert back to conventional PCI mode and the operating frequency is adjusted to match that of the slowest device on the bus.

Manufacturers of PCI bus adapter boards routinely perform functional testing on PCI bus adapters so as to validate the functionality of the adapters during production. Such functionality tests are achieved by connecting the adapter board to be tested to a server or host machine and running a test program on the host machine to control power and signals to the connected adapter board. The adapter board is connected to the host machine using an isolated test slot which enables the adapter board to be added and removed without powering down the entire host system. Such a technique enables functional testing to be performed without having to use expensive steps and provides substantial time and labor savings during production testing.

A known isolation test slot used in existing manufacturing test systems for testing PCI and/or PCI-X bus adapters consists of a stackup of boards; an bus isolation extender, such as for example a ADEX™ isolation extender, stacked on the motherboard, followed by a riser card stacked on the isolation extender and a wearout connector stacked on the riser card. The riser card and the wearout extender serve to protect the connector of the bus isolation extender from being worn out by repeated insertions of the bus adapters for testing and ensure that the bus is extended outside the host machine to facilitate insertion and removal of the PCI/PCI-X adapters.

One major drawback of the aforementioned existing test systems is that the systems are incapable of validating PCI-X adapters operating at PCI-X clock rates, that is, rates up to 133 MHz. In fact, PCI-X adapters can only be tested by such test systems at clock speeds of 33 MHz or 66 MHz, that is, at PCI clock rates, even though the PCI-X bus adapters are capable of operating up to the higher 133 MHz clock rates.

There is, therefore, a need to provide a test system and methodology for testing the functionality of PCI/PCI-X bus adapters which is capable of testing PCI-X adapters operating at higher PCI-X rates in a reliable manner.

The embodiments disclosed herein therefore directly address the shortcomings of known techniques for testing PCI/PCI-X bus adapters by providing a system and methodology which ensures that PCI-X adapters can be tested at required PCI-X rates, that is, at clock rates higher than standard 33 MHz-66 MHz PCI rates.

BRIEF SUMMARY

It is therefore one aspect of the embodiments to provide an improved method of testing PCI/PCI-X bus adapters.

It is another aspect of the embodiments to provide a method of validating PCI/PCI-X bus adapters at required PCI or PCI-X operating rates, respectively.

It is a further aspect of the embodiments to provide an automated system for testing the functionality of PCI-X bus adapters operating at higher PCI-X rates, such as 100 MHz or 133 MHz.

It is also another aspect of the embodiments to provide a computer program, which when run on a computer, performs a method of testing PCI/PCI-X bus adapters at the required PCI or PCI-X operating rates, respectively.

The aforementioned aspects and other objectives and advantages can now be achieved as described herein. In one aspect, an automated system for validating Peripheral Component Interconnect (PCI) bus adapters or PCI-X bus adapters has a computer including a motherboard, a PCI-X bus and an isolated test slot for operatively coupling a PCI/PCI adapter under test through the PCI-X bus to the motherboard. The isolated test slot is adapted and arranged to minimize degradation of data flow on the PCI-X bus such that a PCI-X adapter, mounted in the isolated test slot, can negotiate to a required operating rate which is greater than PCI operating rates. In this manner, a PCI-X adapter mounted in the isolated test slot can negotiate to required operating rates which are higher than the conventional PCI operating rates. Advantageously, the manufacturing test system can therefore validate the functionality of PCI adapters at operating rates of 33 MHz or 66 MHz and/or of PCI-X adapters at higher PCI-X operating rates of 100 MHz, 133 MHz or above.

The computer can be configured as a low profile system, such as a 2U low profile system. The isolated test slot can be configured as a low profile slot, such as for example a bus isolation extender and a wearout extender stacked thereon.

According to another aspect, a method of validating Peripheral Component Interconnect (PCI) bus adapters or PCI-X bus adapters is provided. A PCI/PCI-X adapter is operatively coupled through a PCI-X bus to a motherboard of a computer so as to minimize degradation of data flow on the PCI-X bus such that a PCI-X adapter can negotiate to a required operating rate which is greater than PCI operating rates. The PCI/PCI-X adapter under test negotiates to a required operating rate. The functionality of the PCI or PCI-X bus adapter is then tested at the required PCI or PCI-X operating rates, respectively.

The actual operating rate of the PCI/PCI-X adapter can be verified to ensure that the PCI/PCI-X adapter is operating at the required operating rate. The expected operating rate, predefined for the PCI/PCI-X adapter under test, can be determined. The actual operating rate of the PCI/PC-X adapter can also be determined and compared with the expected operating rate so as to verify that the PCI/PCI-X adapter is actually operating at the expected rate. The actual operating rate can be determined by reading an internal register of the PCI/PCI-X adapter whereas the expected operating rate can be determined by a user.

Advantageously, the aforementioned method of validating PCI/PCI-X adapters can verify that the actual operating rate of a PCI-X adapter under test is operating at the higher PCI-X operating rate, that is 100 MHz or up to 133 MHz, and/or that a conventional PCI adapter under test is operating at the PCI maximum operating rate of 33 MHz or 66 MHz. In this manner, the functionality of the PCI/PCI-X adapter can be reliably tested at the required PCI/PCI-X operating rates, respectively. This validation method enables clean and fast testing to PCI-X rates in a manufacturing environment with no harm caused to the adapters under test.

According to yet another aspect, a computer program product comprises a computer-usable data carrier storing instructions that, when executed by a computer, cause the computer to perform the aforementioned method of validating Peripheral Component Interconnect (PCI) bus adapters or PCI-X bus adapters.

BRIEF DESCRIPTION OF THE DRAWINGS

The accompanying figures, in which like reference numerals refer to identical or functionally similar elements throughout the separate views and which are incorporated in and form a part of the specification, further illustrate the embodiment, together with the background, brief summary, and detailed description, serve to explain the principles of the illustrative embodiment.

DETAILED DESCRIPTION

The illustrative embodiment provides an approach to validating the functionality of PCI or PCI-X adapters using an automated system which ensures that PCI/PCI-X adapters are tested at the required PCI/PCI-X operating rates, respectively.

Figure 1:
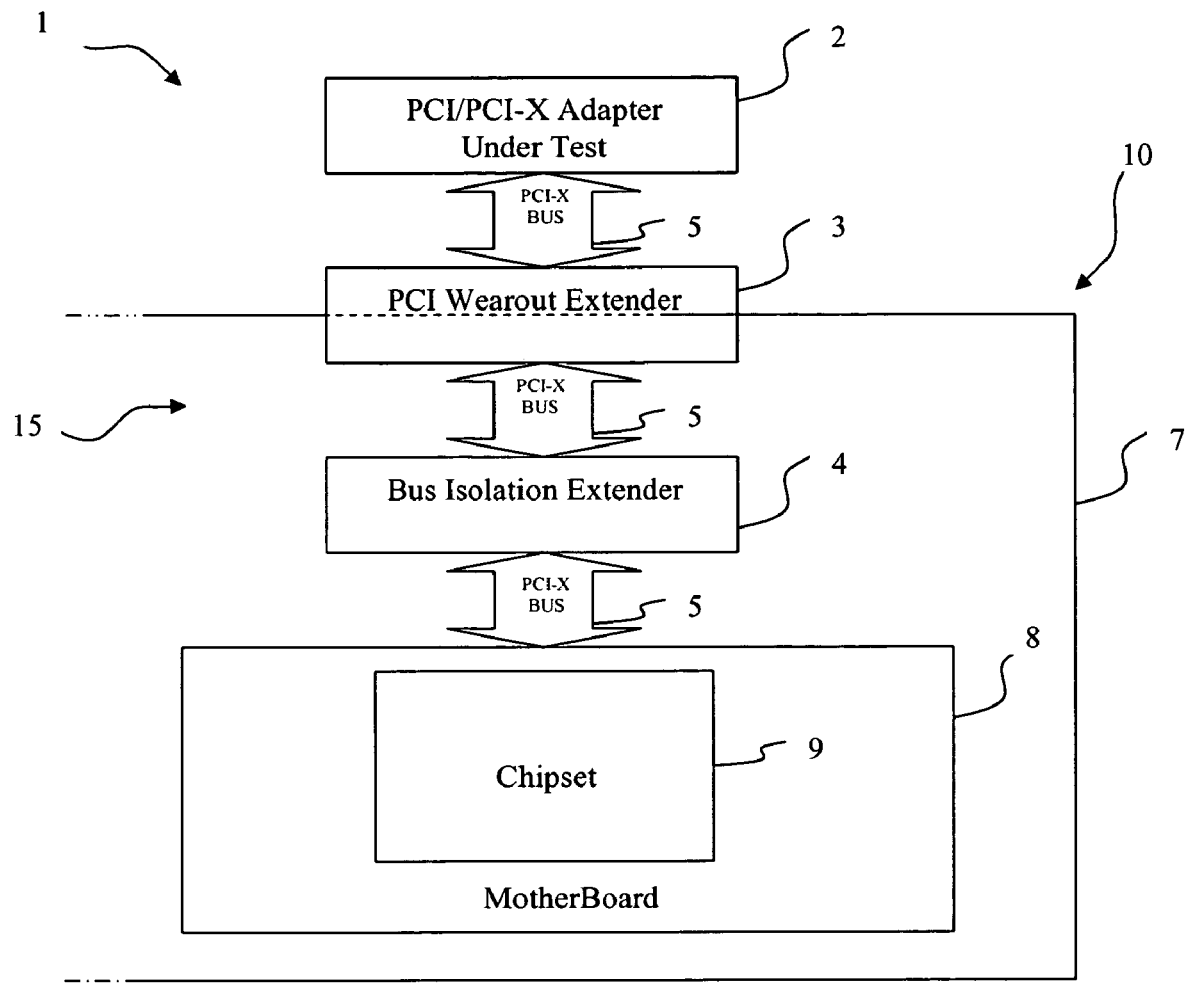
FIG. 1 illustrates a block-diagram of a manufacturing test system for validating PCI or PCI-X bus adapters according to a preferred embodiment.

Referring to FIG. 1 of the accompanying drawings, which illustrates a block diagram of a manufacturing test system for validating PCI/PCI-X bus adapters according to one embodiment, a manufacturing test system 1 has a computer system 10 employing a Peripheral Component Interconnect (PCI)-X bus system and an isolated test slot 15 for receiving a PCI or PCI-X adapter 2 to be tested, such as a PCI or PCI-X host bus adapter. The computer system can be for example a Personal Computer (PC) or server. As will be explained in more detail below, the isolated test slot 15 is configured operatively to couple the PCI/PCI-X adapter 2 through a PCI-X bus 5 to the motherboard 8 of the computer system 10 such that, unlike with existing test systems, a PCI-X adapter 2 can be tested at the required operating rates which are higher than PCI 66 MHz clock rates, such as 100 MHz or even 133 MHz clock rates.

Typically, the motherboard 8 contains the CPU, BIOS, memory, mass storage interfaces, serial and parallel ports, expansion slots and other connectors for connecting components including the isolated test slot 15. A chipset 9, attached to the motherboard 8, consists of controllers required to control the system hardware such as the CPU, memory and peripheral devices including the PCI/PCI-X adapter board 2 under test.

Figure 2:
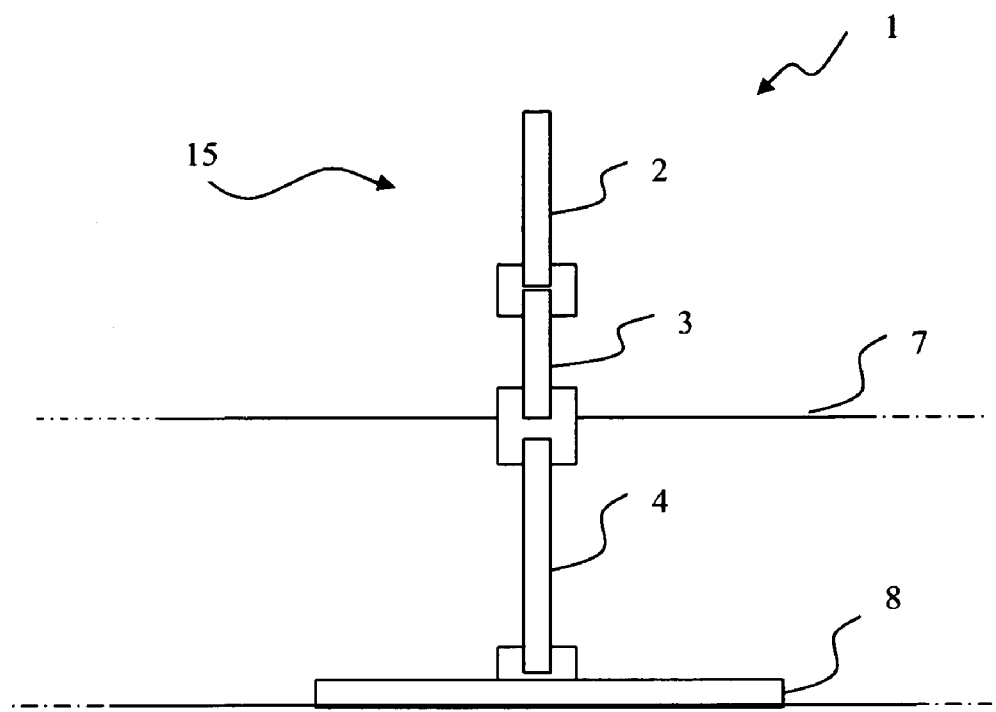
FIGS. 2 & 3 illustrate partial cross-sectional views taken from the rear and side of the test system, respectively, showing the isolated test slot and bus adapter connected to the motherboard as represented in FIG. 1.
Figure 3:
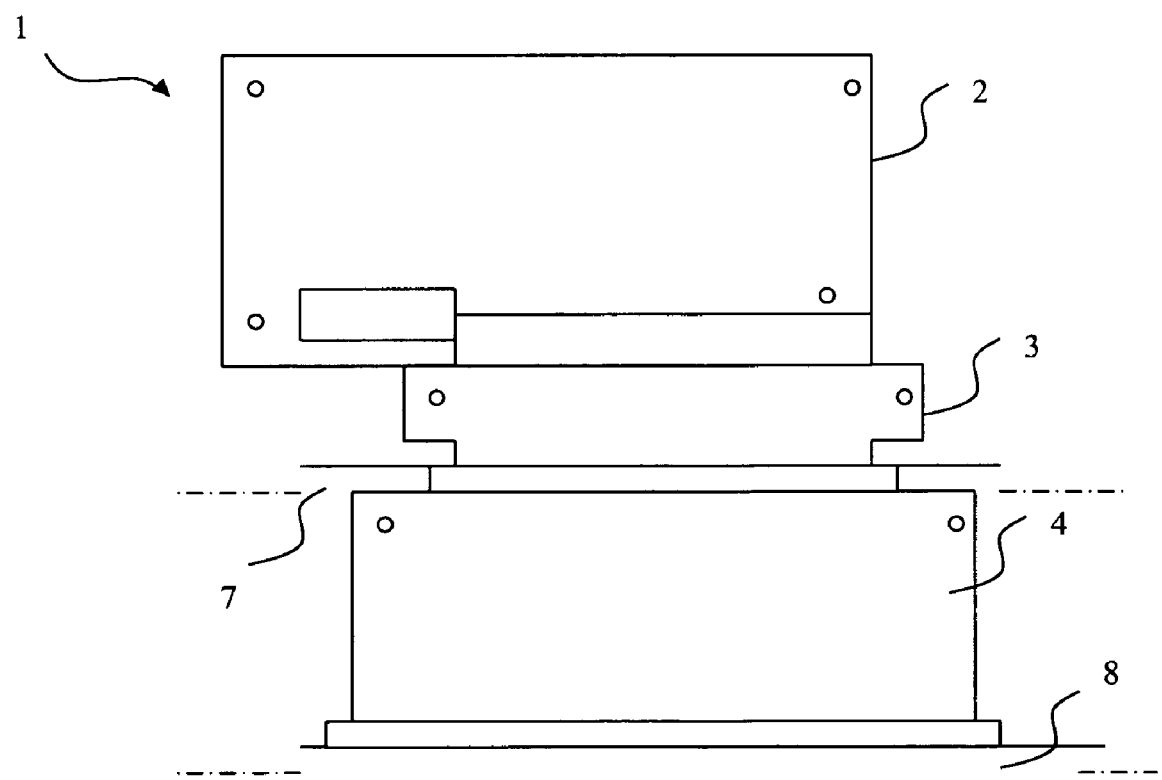

The isolated test slot 15 is configured operatively to couple the PCI-X adapter mounted therein through the PCI-X bus 5 to the chipset 9 such that the integrity of data signals flowing on the PCI-X bus 5 is maintained even at the higher operating rates of the PCI-X adapter. This is achieved in the illustrative embodiment by configuring the computer test system 10 as a low profile system 10 and by adapting and arranging the isolated test slot 15 so that it too has a low profile, as best shown in FIGS. 2 & 3, which illustrate partial cross-sectional views taken from the rear and side, respectively, of the bus adapter and isolated test slot connected to the motherboard as represented in FIG. 1. The motherboard 8 and other components of the low profile computer system 10 are arranged within a low profile enclosure 7. In the illustrative embodiment, the low profile computer system 10 is a 2U low profile system including a 2U chassis as is known in the art.

The low profile isolated test slot 15 consists of a PCI/PCI-X bus isolation extender 4, such as for example, an ADEX™ bus isolation extender, which has an approximate height of 2 inches, and a PCI/PCI-X wearout extender 3, which has a standard height of approximately 1 inch, stacked thereon. An isolated test slot 15 of this configuration extending more than about 3 inches can impair signal integrity and intermittent failures may result. A daughter board used to control signals is also mounted on the Adex™ extender, however, this does not add any height to the stackup and does not form part of the isolated test slot for the purpose of coupling the adapter through the PCI-X bus to the motherboard. The bus isolation extender 4 enables the PCI/PCI-X under test to be replaced by another PCI/PCI-X adapter without having to power down the entire test system 1 and the wearout extender 3 protects the isolation extender 4 from wearing out due to repeatedly inserting and removing the PCI/PCI-X adapter board 2 under test.

By adopting a low profile computer system 10, the low profile isolated test slot 15 can physically extend outside the enclosure 7 for receiving the PCI/PCI-X adapter 2, as is required to enable the adapter to be tested, whilst providing connection to the motherboard 8 using traces having a minimum length so as to minimize degradation of data signals flowing on the PCI-X bus 5 even at the higher PCI-X operating rates. In this manner, a PCI-X adapter mounted in the isolated test slot 15 can negotiate to required operating rates which are higher than the conventional PCI operating rates. Advantageously, the manufacturing test system 1 can therefore validate the functionality of PCI adapters at operating rates of 33 MHz or 66 MHz and of PCI-X adapters at higher PCI-X operating rates of 100 MHz, 133 MHz or above.

Whilst the low profile isolated test slot 15 utilized in the illustrative embodiment consists of a separate bus isolation extender 4 and a wearout extender 3 stacked thereon, any type of isolated test slot can be employed which can physically extend the PCI-X bus 5 outside the computer system 10 but which has a sufficiently low profile to enable a PCI-X adapter 2 mounted therein to be operatively coupled to the motherboard 8 through the PCI-X bus such that the integrity of signals communicating on the PCI-X bus between the motherboard 8 and the PCI-X adapter is not compromised even at the higher PCI-X operating rates. Furthermore, other low profile computer systems which have enclosures with sufficiently low profiles to enable the isolated test slot to physically extend outside the enclosure, as needed, can be utilized in the manufacturing test system 1 instead of the 2U low profile system 10 of the illustrative embodiment.

Figure 4:
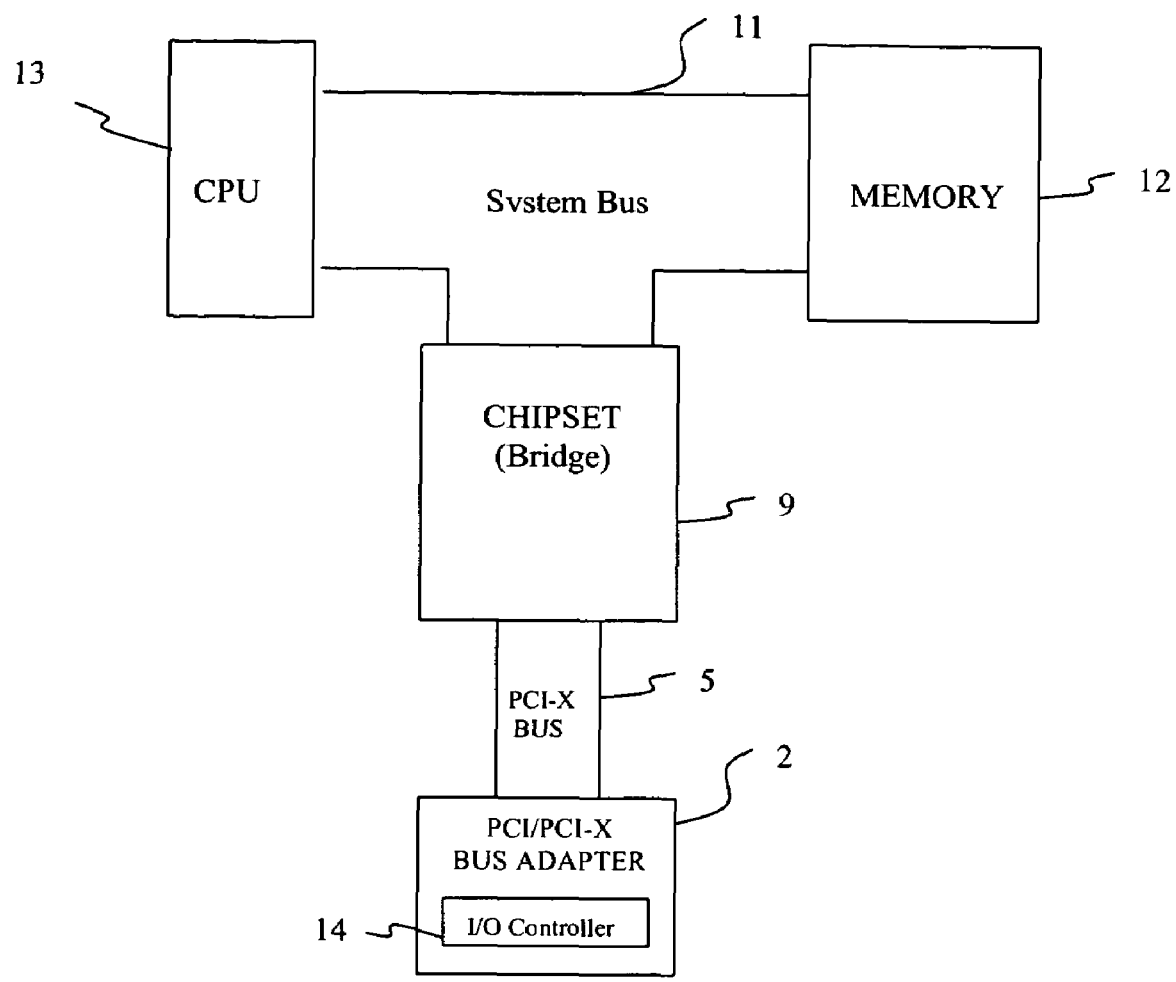
FIG. 4 illustrates a schematic diagram outlining the bus layout of the motherboard and PCI/PCI-X adapter connected as represented in FIG. 1.

Referring to FIG. 4, which depicts a schematic diagram outlining the bus layout of the motherboard 8 with the PCI/PCI-X adapter connected thereto, system bus 11 couples together the CPU 13, the memory 12 and the chipset 9 which controls the data flow between the CPU 13, memory 12, and the other components of the computer system including the PCI/PCI-X adapter 2. PCI-X bus 5 couples the chipset 9 to the PCI/PCI-X bus adapter 2. The PCI/PCI-X adapter 2 has a chipset therein including an I/O controller 14 which has an internal register for receiving data representing the actual operating rate negotiated between the PCI/PCI-X adapter and chipset 9.

An operating system runs on the CPU 13 to coordinate and control various components within the test system 1. The operating system may be a commercially available operating system such as the Disk Operating System (DOS). Instructions for the operating system and applications or programs are stored in storage devices, such as a hard drive. The computer system includes a testing module loaded thereon providing instructions that, when executed by the CPU, cause test system 1 to perform a method of validating the PCI/PCI-X bus adapter 2 under test as will be described in more detail below.

Figure 5:
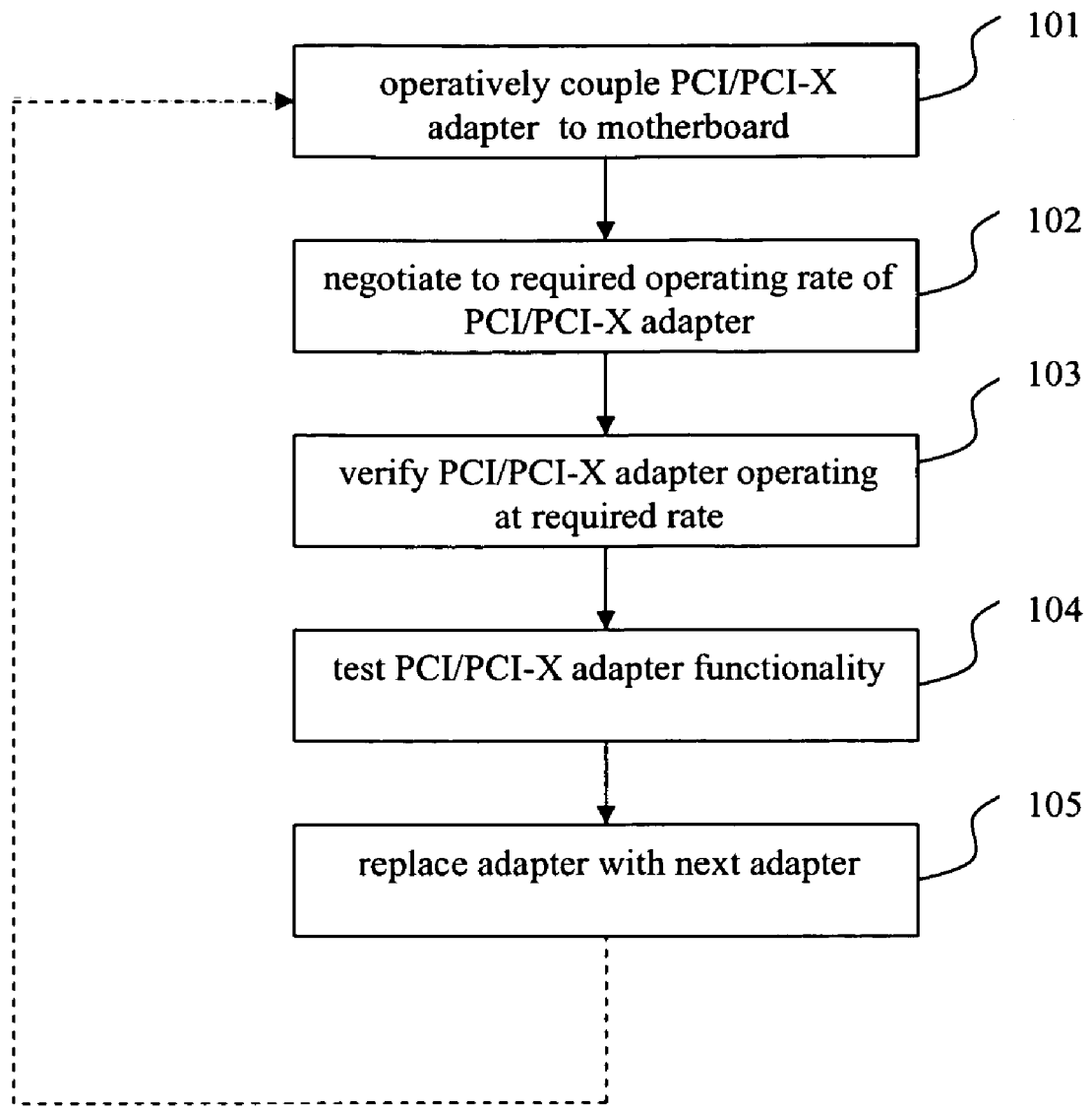
FIG. 5 illustrates a flow-diagram outlining a method of validating PCI/PCI-X bus adapters according to a preferred embodiment.

FIG. 5 provides a general overview of the steps performed in the method of validating a PCI-X adapter in accordance with an embodiment. This method can be implemented in an automated system, such as for example, the manufacturing test system 1 of the illustrative embodiment of FIG. 1.

Referring to FIG. 5, in conjunction with FIG. 1, initially, a bus adapter 2 to be tested is operatively coupled through the PCI-X bus 5 to the motherboard 8 as indicated in step 101. In the illustrative embodiment of the test system 1, this is achieved by mounting the bus adapter 2 in the isolated test slot 15. The computer system 10 is operable by executing the testing module so that the PCI-X adapter negotiates to an operating rate of the PCI/PCI-X bus adapter. Initial negotiation is controlled by the test system 1 at power up, and is defined in the PCI and PCI-X protocol. A conventional PCI adapter 2 under test is able to negotiate to an operating rate of 33 MHz or 66 MHz, however, unlike with existing test systems, a PCI-X bus adapter 2 under test is able to negotiate up to the required higher PCI-X operating rates, that is, at clock rates above 66 MHz and up to 133 MHz, because the isolated test slot is operatively coupled through the PCI-X bus to the motherboard 8 such that the integrity of data flow between the motherboard and a PCI-X adapter is maintainable at both higher PCI-X and lower PCI operating rates. If highly reliable testing of the PCI-X adapters is required in a manufacturing environment, an operating rate of 100 MHz or 133 MHz during testing is preferred.

Thus, either the PCI or PCI-X adapter bus 2 under test is able to negotiate to its required operating rate of 33-66 MHz or greater than 66 MHz, respectively, as indicated in step 102 of FIG. 5. Thereafter, a verification that the PCI/PCI-X adapter is operating at the required rate is made as indicated in step 103. The bus adapter functionality is then tested as indicated in step 104. Once functionality testing has completed, the PCI/PCI-X adapter under test can be removed and, if necessary, be replaced by another PCI/PCI-X adapter as indicated in steps 105,101. This is achieved by powering down and isolating the isolated test slot 15, replacing the PCI/PCI-X adapter under test, and reapplying power and signals to the isolated test slot.

Figure 6:
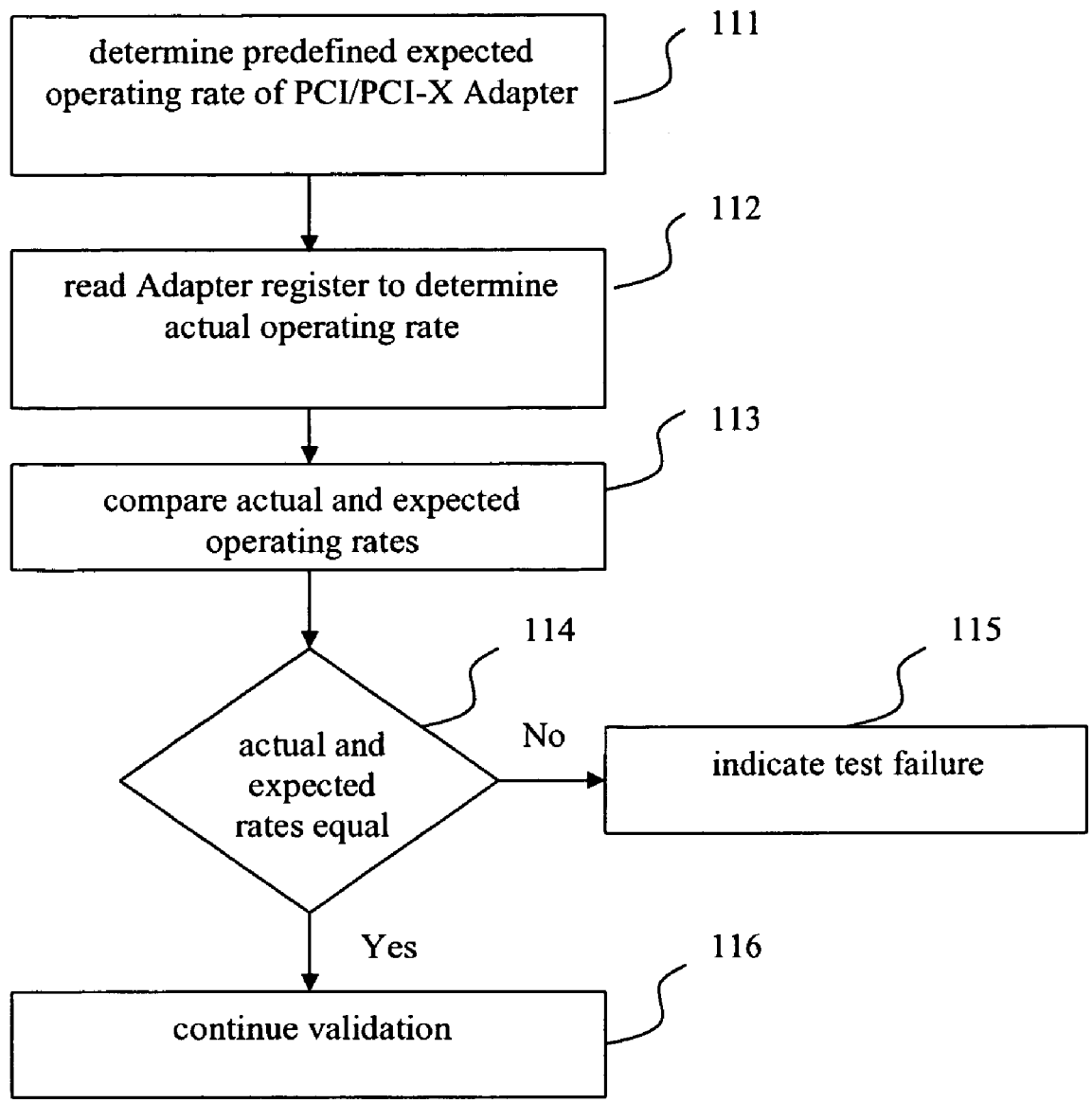
FIG. 6 illustrates a flow-diagram describing in more detail the method step of verifying the operating rate of the PCI/PCI-X bus adapter set forth in FIG. 5.

The method of verifying that the PCI/PCI-X adapter is operating at the correct required operating rate as indicated in step 103 will now be described in more detail with reference to FIG. 4 and FIG. 6, which illustrates a flow-diagram outlining the verification process. The expected operating rate, pre-defined for each adapter product under test, is determined. Data representing the expected rate is provided to the test module software in a file, such as for example, by a user manually entering the expected rate into the test system 1 via a user interface. Note that, if a PCI-X bus adapter is identified, the expected or required operating rate is preferably pre-defined at 100 MHz rather than 133 MHz so as to ensure reliability during testing. Once the PCI/PCI-X adapter 2 has negotiated to an actual operating rate, the actual operating rate is determined. Data representing the actual operating rate is loaded into the internal registers of the bus adapter I/O controller 14. The register receives the data through standard PCI/PCI-X negotiation. Then, the internal register of the I/O controller 14 is interrogated to determine the actual operating rate of the PCI/PCI adapter, as indicated in step 112.

Thereafter, data representing the predefined expected operating rate for the particular adapter PCI/PCI-X adapter 2 under test and the actual operating rate of the adapter are compared in order to verify that the adapter is actually operating at the required rate. If the actual and expected operating rates are equal, the validation method is continued (steps 114,116). If, however, actual and expected operating rates are not equal, then a failure message is indicated to an operator at a user interface of the computer notifying the operator that the board under test has failed, as indicated in steps 114,115. Thereafter, the method of validation is continued or halted as necessary.

Advantageously, the aforementioned method of validating PCI/PCI-X adapters can verify that the actual operating rate of a PCI-X adapter 2 under test is operating at the higher PCI-X operating rate, that is 100 MHz or up to 133 MHz, for the purpose of testing the functionality of the adapter. Additionally, the method can verify a conventional PCI adapter 2 under test is operating at the PCI maximum operating rate of 33 MHz or 66 MHz. In this manner, the functionality of the PCI/PCI-X adapter 2 can be reliably tested at the required PCI/PCI-X operating rates, respectively. This validation method enables clean and fast testing to PCI-X rates in a manufacturing environment with no harm caused to the adapters under test.

It will be appreciated that variations of the above-disclosed and other features, aspects and functions, or alternatives thereof, may be desirably combined into many other different systems or applications.

Also, it will be appreciated that various presently unforeseen or unanticipated alternatives, modifications, variations or improvements therein may be subsequently made by those skilled in the art which are also intended to be encompassed by the following claims.

What is claimed is:

1. An automated system for validating Peripheral Component Interconnect (PCI) bus adapters or PCI-X bus adapters comprising:
    a computer, said computer including
        a motherboard
        a PCI-X bus, and
        an isolated test slot for operatively coupling a PCI/PCI-X adapter under test through said PCI-X bus to said motherboard, said isolated test slot being adapted and arranged to minimize degradation of data flow on said PCI-X bus such that a PCI-X adapter, mounted in said isolated test slot, can negotiate to a required operating rate which is greater than PCI operating rates, wherein said computer is operable to negotiate with and test a PCI or PCI-X bus adapter mounted in said isolated test slot at the required PCI or PCI-X operating rate, respectively; and
    wherein said PCI/PCI-X adapter under test includes an internal register, said internal register receiving, through PCI/PCI-X negotiation, data representing the actual operating rate at which said PCI/PCI-X adapter has negotiated with said computer, and wherein said computer is operable to verify said PCI/PCI-X adapter is operating at said required PCI/PCI-X rate by comparing said data of said internal register with data representing an expected rate, predefined for said PCI/PCI-X adapter under test, loaded into said computer.

2. The system of claim 1, wherein said computer is configured as a low profile system and wherein said isolated test slot is configured as a low profile slot.

3. The system of claim 2, wherein said low profile system comprises a 2U low profile system.

4. The system of claim 1, wherein said adapter mounted in said isolated test slot is a PCI-X bus adapter and wherein said required operating rate is at least 100 MHz.

5. The system of claim 1, wherein said computer system is adapted and arranged to verify that the PCI or PCI-X adapter under test is operating at said required PCI or PCI-X rate, respectively.

6. A method of validating a Peripheral Component Interconnect (PCI) bus adapters or PCI-X bus adapters comprising:
    operatively coupling a PCI/PCI-X adapter through a PCI-X bus to a motherboard of a computer, said PCI/PCI-X adapter including an internal register, and said coupling minimizing degradation of data flow on said PCI-X bus such that a PCI-X adapter can negotiate to a required operating rate which is greater than PCI operating rates,
    negotiating a required operating rate of said coupled PCI/PCI-X bus adapter,
    receiving at said internal register, through PCI/PCI-X negotiation, data representing the actual operating rate at which said PCI/PCI-X adapter has negotiated with said computer, and
    testing the functionality of the PCI or PCI-X bus adapter at the required PCI or PCI-X operating rates, respectively; wherein testing the functionality of said PCI or PCI-X bus adapter comprises:
        verifying said PCI/PCI-X adapter is operating at said required PCI/PCI-X rate by comparing said data of said internal register with data representing an expected rate, predefined for said PCI/PCI-X adapter under test, loaded into said computer.

7. The method of claim 6, wherein said PCI/PCI-X adapter is operatively coupled to said motherboard by means of a low profile isolated test slot.

8. The method of claim 6, wherein said PCI/PCI-X bus adapter is a PCI-X adapter and wherein said required operating rate is at least 100 MHz.

9. A computer program product comprising: a computer-usable data carrier storing instructions that, when executed by a computer, cause the computer to perform a method of validating a Peripheral Component Interconnect (PCI) bus adapters or PCI-X bus adapters comprising
    operatively coupling a PCI/PCI-X adapter through a PCI-X bus to a motherboard of a computer, said PCI/PCI-X adapter including an internal register, and said coupling minimizing degradation of data flow on said PCI-X bus such that a PCI-X adapter can negotiate to a required operating rate which is greater than PCI operating rates,
    negotiating a required operating rate of said coupled PCI/PCI-X bus adapter, and
    testing the functionality of the PCI/PCI-X bus adapter at the required PCI or PCI-X operating rate, respectively; wherein testing the functionality of said PCI or PCI-X bus adapter comprises:
        verifying said PCI/PCI-X adapter is operating at said required PCI/PCI-X rate by comparing said data of said internal register with data representing an expected rate, predefined for said PCI/PCI-X adapter under test, loaded into said computer.

* * * * *